United States Patent [19]
Arai

[11] 4,242,378
[45] Dec. 30, 1980

[54] METHOD OF MAKING A DECORATED FILM WITH A METAL LAYER IN THE FORM OF A GIVEN PATTERN

[75] Inventor: Yoshiaki Arai, Kyoto, Japan
[73] Assignee: Reiko Co., Ltd., Kyoto, Japan
[21] Appl. No.: 25,054
[22] Filed: Mar. 29, 1979
[51] Int. Cl.³ .................. B05D 1/36; B05D 3/00; B05D 5/00; B44C 1/22
[52] U.S. Cl. .................. 427/264; 156/634; 156/655; 156/656; 156/659.1; 156/668; 427/270; 427/271
[58] Field of Search .................. 156/629–634, 156/650–652, 654–656, 659–661, 664–666, 901, 902; 96/35.1, 36, 36.2, 38.1, 38.2; 427/259, 264, 270, 271, 272, 282, 258, 294, 404, 419; 204/18.1; 252/79.3, 79.5

[56] References Cited
U.S. PATENT DOCUMENTS

| | | | |
|---|---|---|---|
| 2,435,889 | 2/1948 | Kerridge | 156/659 X |
| 2,731,333 | 1/1956 | Ko et al. | 156/652 |
| 2,748,031 | 5/1956 | Kafig | 427/270 X |
| 3,222,175 | 12/1965 | Rasch | 96/36 |
| 3,935,334 | 1/1976 | Narui et al. | 427/272 X |

Primary Examiner—William A. Powell

[57] ABSTRACT

The method of making a decorated film with a metal layer in the form of a given pattern comprises the steps of forming a metal layer on at least one surface of a base sheet through the utilization of the vacuum plating technique and removing a preselected area of said metal layer from said base sheet. When a water-insoluble resin is used, the resin is printed on the metal layer to form a positive resinous pattern and then the printed material is immersed in a metal soluble aqueous solution to remove the exposed metal layer without the resinous pattern. When a water-soluble resin is used, the resin is printed on the base sheet to form a negative resinous pattern and then the metal layer is formed on the surface with the resinous pattern. The resultant material is immersed in water to dissolve the resin and simultaneously remove the metal coated on the resinous pattern together with the resin.

1 Claim, 15 Drawing Figures

METHOD OF MAKING A DECORATED FILM WITH A METAL LAYER IN THE FORM OF A GIVEN PATTERN

BACKGROUND OF THE INVENTION

This invention relates to a method of making a decorated film with a metal layer in the form of a given pattern and particularly relates to a method of making a decorated film with a metal layer of the form of various patterns through the utilization of the general vacuum plating (vapor deposition) technique and printing method.

Metallized films have been used broadly as packing materials, decorations, gold or silver threads and the like. Most of them have a metal layer on the whole surface and do not have it in the form of a specific pattern. In order to prepare a decorated film with a metallic pattern, vacuum plating techniques with the use of masking materials such as metal sheets, films and tapes have been known. However, in this method, there are not obtained metallic patterns having a clear edge and the metallic patterns other than stripes are not continuously produced.

The primary object of the invention is to provide an improved method of making a decorated film with a metallic pattern as desired.

Another object of the invention is to provide an improved method of continuously making various decorated films with a desired metallic pattern with the combined use of vacuum plating technique and general printing method.

Other objects and advantages of the invention will be apparent from the following detailed description.

SUMMARY OF THE INVENTION

According to the invention, a decorated film with a metal layer in the form of a given pattern is made by a method comprising the steps of forming a metal layer on at least one surface of a base sheet through the utilization of the vacuum plating technique and removing a preselected area of said metal layer from said base sheet.

In one aspect of the invention a water-insoluble resin is printed on the metal layer to form a positive resinous pattern and then the resultant material is immersed in a metal soluble aqueous solution to remove the exposed metal layer without the resinous pattern.

In another aspect of the invention a water-soluble resin is printed on the surface of the base sheet to form a negative resinous pattern prior to forming the metal layer. The metal layer is formed on the surface of the base sheet with the resinous pattern and then the resultant material is immersed in water to dissolve the resin and simultaneously to remove the metal coated on the resinous pattern together with the resin.

BRIEF DESCRIPTION OF THE INVENTION

Figure 1:
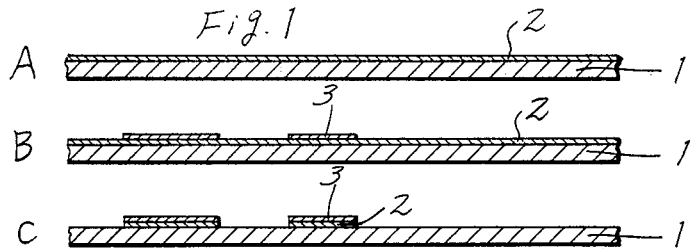
FIG. 1, A-C, is a schematic illustration of the steps utilized in making a decorated film according to the invention.

In FIG. 1 is shown an embodiment in which a water-insoluble resin is printed. In this case, a metal is coated by a vacuum plating on a base sheet (1) to form a metal layer (2), and then a water-insoluble resin (3) is printed on the metal layer (2). The printed material is immersed in a metal soluble aqueous solution to remove the exposed portion of the metal layer without the resin (3). Resultantly, there is obtained a decorated film having the metal layer (2) in the same pattern as the resin (3).

Figure 2:
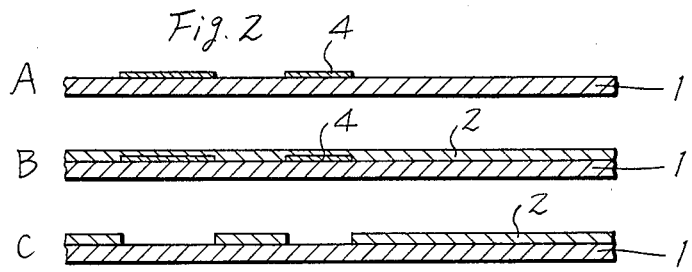
FIG. 2, A-C, is a schematic illustration of the steps utilized in making another decorated film according to the invention.
Figure 3:
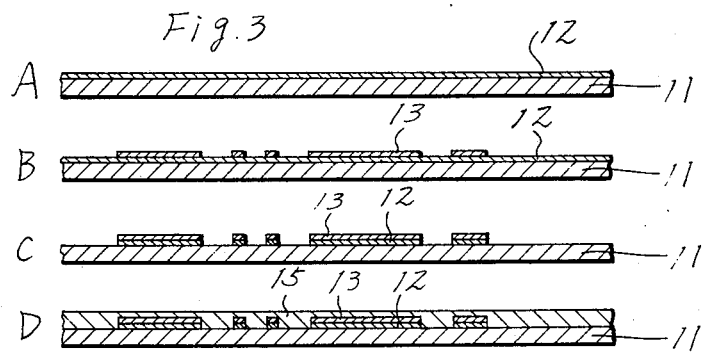
FIG. 3, A-D, illustrates the procedure used in Example 3 to produce a packing sheet according to the invention.
Figure 4:
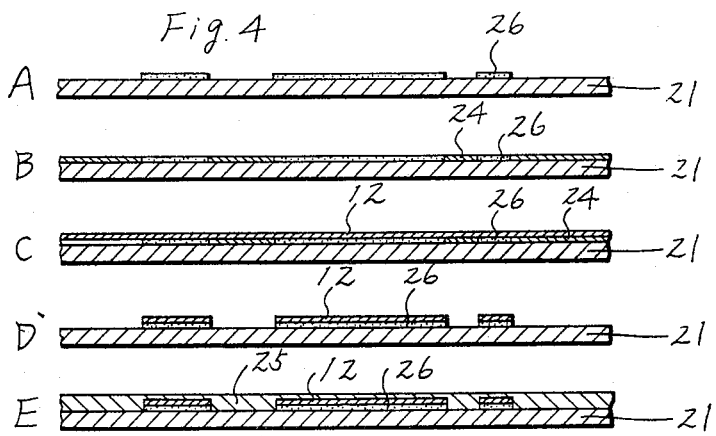
FIG. 4, A-E, illustrates the procedure used in Example 4 to produce a packing sheet according to the invention.

In FIG. 2 is shown another embodiment in which a water-soluble resin is printed. A water-soluble resin (4) is printed on a base sheet (1) and then a metal layer (2) is formed on the base sheet (1) printed with the resin (4). The resultant material is immersed in water to dissolve the resin (4) and to remove the metal coated on the resin (4) together with the resin.

It is necessary that the base sheet (1) used in the invention be a water proof material. As the base sheet (1) there are included plastic films, cellophanes, laminated films, and paper coated with at least one hydrophobic resin. For example, polyethylene films, polypropylene films, polystyrene films, polyester films, polyvinyl chloride films, polycarbonate films, polypropylene films coated with polyvinylidene chloride, polyamide films coated with polyvinylidene chloride, complex films of oriented polypropylene with cast polypropylene and moisture proof cellophanes are preferably used. Oriented films may be used as the above films.

Though the thickness of the base sheet (1) is not particularly limited, a sheet of 10 to 50 microns is preferably used. The surface of the base sheets (1) may be pretreated with a corona discharge, an anchor coating and the like to activate it.

The metal layer (2) according to the invention may be obtained by a general vacuum plating technique. The thickness of it is generally selected within the range of 10 to several thousands Å, preferably 300 to 600 Å. Among the metals for vacuum plating there are included aluminum, copper, gold, silver, tin, zinc, chromium, nickel and the like. Aluminum is most preferably used.

Using a water-insoluble resin (3), the printing process should be carried out after forming the metal layer (2). In this case the base sheet (1) having the metal layer (2) printed with the resin (3) is immersed in an alkaline or acid aqueous solution such as 0.5 to 10%, preferably 1 to 3%, aqueous solution of sodium or potassium hydroxide, 0.5 to 2% aqueous solution of hydrofluoric acid and the like, to dissolve and remove the exposed metal layer without the resinuous pattern. Resultantly the metal layer (2) under the resin (3) remains on the base sheet (1) in the same as the resinous pattern.

As the water-insoluble resins (3) there are included general hydrophobic resins such as polyurethane polyamide, polyacrylate, polyester and the like. The resins may be used with additives such as coloring agents, fibers and the like.

On the other hand, using a water-soluble resin (4), the printing process should be carried out before forming the metal layer (2) to form a negative resinous pattern. In this case the base sheet having the metal layer (2) coated on the base sheet (2) printed with the resin (4) may be immersed merely in water to dissolve the resin (4) and to remove simultaneously the metal layer (2) contacted with the resin together with the resin. Resultantly the metal layer (2) remains on the base sheet in the positive pattern.

As the water-insoluble resins (4), there are included polyvinyl alcohol, polyacrylamide, methylcellulode, hydroxyethylcellulose, polyvinylpyrrolidone, polyvinylmethylether, vinylmethylethermaleic anhydride copolymer, water soluble acrylic or methacrylic resin, casein, gelatin, glue and the like. Polyvinyl alcohol is most preferably used.

Those resins (3) (4) may be used in the state of general coating compositions such as aqueous emulsion, aqueous solution and organic solution. They may be printed with a usual printing method such as screen printing, roll printing and gravure printing. Though the thickness of the printed resin is not particularly limited, it is preferably within the range of 0.5 to 3 microns.

As described above, various decorated films with a metal layer (2) in the form of a desired pattern can be easily obtained with the combined use of vacuum plating and general printing. Since a metallic pattern having a clear edge can be produced by only printing a resin in the negative or positive pattern, the process according to the invention is useful to produce continuously a decorated film with a metallic pattern.

The product of the invention is preferably used as packing materials, labels, various decorations and the like. As a packing material, at least one surface of it is preferably heat sealable. There may be used as a base sheet a film having a heat sealing property and at least one surface of a decorated film with a metallic pattern according to the invention may be further coated or bonded with a heat sealable resin. Among heat sealable resins, there are included EVA, polyethylene, cast polypropylene, polyvinylidene chloride and the like. The base sheet may be either transparent or opaque and may retain a color printed pattern or at least one surface. The color printed pattern is preferably covered with a clear ink to improve the vacuum plating property.

DETAILED DESCRIPTION OF THE PREFERRED EMBODIMENT

The following examples serve to illustrate the invention in greater detail although the invention is not limited to the examples. Unless otherwise indicated, % signifies % by weight.

EXAMPLE 1

Aluminum was coated by vacuum plating on a transparent polyethyleneterephthalate film having a thickness of 12 microns under the following conditions:

| | |
|---|---|
| Degree of vacuum | $1 \times 10^{-4}$ Torr |
| Distance between metal and film | 40cm |
| Film running speed | 150 m/min. |
| Thickness of the obtained metal layer | 400 A |

Polyurethane was printed on the obtained aluminum layer. The printed film was immersed in 1% aqueous solution of sodium hydroxide at 60° C. for 20 seconds to remove the exposed aluminum layer without polyurethane pattern. Then the product was treated with a dilute hydrochloric acid to neutralize, rinsed with water and dried.

The product, having aluminum layer in the same pattern as polyurethane, was bonded to a release paper with an adhesive and slitted to prepare labels.

EXAMPLE 2

Example 1 was repeated except that polyurethane was printed with different pattern from Example 1.

To the surface of the product with aluminum pattern polypropylene was laminated and to the opposite surface of it polyethylene was laminated to produce a packing sheet.

EXAMPLE 3

A transparent cast polypropylene film (11) having a thickness of 25 microns was treated with a corona discharge and then an anchor coating of an isocyanate compound. Aluminum was coated by vacuum plating on the pretreated surface of the film to produce an aluminum layer (12) of 350 Å. Then a polyamide resin (13) was printed on the auminum layer (12) in a flower and letter pattern. The printed film was immersed in 1% aqueous solution of sodium hydroxide at 70° C. for 15 seconds to remove the exposed aluminum layer without polyamide pattern. The product, having an aluminum layer (12) in the same flower and letter pattern as polyamide (13), was treated with a dilute hydrochloric acid to neutralize, rinsed with water and dried.

To the surface of the product with aluminum pattern an oriented polypropylene film (15) was dry-laminated to produce a packing sheet.

EXAMPLE 4

A polyethyleneterephthalate film (21) having a thickness of 25 microns was printed with a water-insoluble colored coating composition (26). Then polyvinyl alcohol (24) was applied on the film by gravure printing to produce a polyvinyl alcohol pattern of 3 microns in the form of the patterns of the above colored coating (26) and polyvinyl alcohol (24) not lying one upon another. Aluminum was coated by vacuum plating with degree of vacuum of $2 \times 10^{-4}$ Torr on the whole printed surface to form an aluminum layer (12) of 400 A. The resultant film was immersed in a warm water at 60° C. for 20 seconds to dissolve polyvinyl alcohol (24) and simultaneously to remove the aluminum layer (12) lied on polyvinyl alcohol (24) and dried.

There was obtained the product having the aluminum layer (12) in the form of a clear metallic pattern lied on the above colored coating (26). To the surface with the metallic pattern of the product polyethylene film (25) was bonded with a binder to produce a packing sheet.

EXAMPLE 5

A vinyl chloride resin containing a dyestuff was coated on a whole surface of a rigid polyvinyl chloride resin film having a thickness of 50 microns and dried to form a coloring layer. A methylcellulose coating composition was printed on the coloring layer. Then aluminum was coated with vacuum printing on the whole surface with methylcellulose pattern to form an aluminum layer of 350 Å. The metallized film was immersed in warm water at 50° C. for 30 seconds to dissolve the methylcellulose and simultaneously to remove the aluminum layer contact with methylcellulose and then dried.

Thus the obtained decorated film, in which one surface had a metallized part in the desired pattern and the residual part exposing the above coloring layer and another surface visually exposed the coloring layer through the rigid polyvinyl chloride resin film, was cut to prepare films for an artificial flower.

What I claim is:

1. In a method of making a decorated film with a metal layer in the form of a given pattern and comprising the steps of depositing a metal layer on at least one surface of a water-resistant base sheet by vacuum plating technique and removing a preselected area of said metal layer from said base sheet, the improvement comprising: printing a patterned water-insoluble colored coating composition on said surface; printing a patterned water-soluble resin on the resultant printed surface in such a manner that the printed pattern of said water-soluble resin is jig-saw matched with the printed pattern of said water-insoluble colored coating composition; depositing said metal layer on the entire resultant double-printed surface; and immersing the resultant metal-coated material in water to dissolve said water-soluble resin and concurrently remove the metal deposited on said water-soluble resin.

* * * * *